(12) United States Patent
Huang et al.

(10) Patent No.: US 10,269,675 B2
(45) Date of Patent: Apr. 23, 2019

(54) CONDUCTIVE LINE SYSTEM AND PROCESS

(71) Applicant: Taiwan Semiconductor Manufacturing Company, Ltd., Hsinchu (TW)

(72) Inventors: Yu Yi Huang, Yongjing Township (TW); Hung-Jui Kuo, Hsinchu (TW); Chung-Shi Liu, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/837,194

(22) Filed: Dec. 11, 2017

(65) Prior Publication Data

US 2018/0108590 A1    Apr. 19, 2018

Related U.S. Application Data

(60) Continuation of application No. 15/180,372, filed on Jun. 13, 2016, now Pat. No. 9,842,790, which is a
(Continued)

(51) Int. Cl.
*H01L 23/31* (2006.01)
*H01L 21/768* (2006.01)
(Continued)

(52) U.S. Cl.
CPC ...... *H01L 23/3192* (2013.01); *H01L 21/0274* (2013.01); *H01L 21/02118* (2013.01);
(Continued)

(58) Field of Classification Search
CPC ............. H01L 23/3192; H01L 23/3171; H01L 21/0274; H01L 21/76802; H01L 21/76879;
(Continued)

(56) References Cited

U.S. PATENT DOCUMENTS

| 4,072,527 A | 2/1978 | Fan |
| 4,212,935 A | 7/1980 | Canavello et al. |

(Continued)

FOREIGN PATENT DOCUMENTS

| EP | 1500977 A1 | 1/2005 |
| JP | 2006145788 A | 6/2006 |

(Continued)

OTHER PUBLICATIONS

Hoo, Ng Wah et al., "The Effect of UPW Quality on Photolithography Defect," Proc. SPIE 7520, Lithography Asia 2009, Dec. 14, 2009, 7 pages, vol. 7520, SPIE, Taipei, Taiwan.
(Continued)

*Primary Examiner* — Sonya D. McCall-Shepard
(74) *Attorney, Agent, or Firm* — Slater Matsil, LLP

(57) ABSTRACT

A system and method for providing a conductive line is provided. In an embodiment the conductive line is formed by forming two passivation layers, wherein each passivation layer is independently patterned. Once formed, a seed layer is deposited into the two passivation layers, and a conductive material is deposited to fill and overfill the patterns within the two passivation layers. A planarization process such as a chemical mechanical polish may then be utilized in order to remove excess conductive material and form the conductive lines within the two passivation layers.

20 Claims, 7 Drawing Sheets

Related U.S. Application Data continuation of application No. 14/833,760, filed on Aug. 24, 2015, now Pat. No. 9,368,402, which is a division of application No. 13/929,641, filed on Jun. 27, 2013, now Pat. No. 9,117,881.

(60) Provisional application No. 61/789,593, filed on Mar. 15, 2013.

(51) Int. Cl.

| | | |
|---|---|---|
| *H01L 21/02* | (2006.01) | |
| *H01L 21/027* | (2006.01) | |
| *H01L 21/288* | (2006.01) | |
| *H01L 23/00* | (2006.01) | |
| *H01L 23/29* | (2006.01) | |
| *H01L 23/532* | (2006.01) | |

(52) U.S. Cl.
CPC ...... *H01L 21/2885* (2013.01); *H01L 21/7684* (2013.01); *H01L 21/76802* (2013.01); *H01L 21/76807* (2013.01); *H01L 21/76816* (2013.01); *H01L 21/76873* (2013.01); *H01L 21/76879* (2013.01); *H01L 23/293* (2013.01); *H01L 23/3171* (2013.01); *H01L 23/5329* (2013.01); *H01L 23/53223* (2013.01); *H01L 23/53238* (2013.01); *H01L 24/03* (2013.01); *H01L 24/05* (2013.01); *H01L 24/11* (2013.01); *H01L 24/13* (2013.01); *H01L 23/53252* (2013.01); *H01L 2221/1031* (2013.01); *H01L 2224/0345* (2013.01); *H01L 2224/0381* (2013.01); *H01L 2224/03452* (2013.01); *H01L 2224/03462* (2013.01); *H01L 2224/03464* (2013.01); *H01L 2224/03616* (2013.01); *H01L 2224/0401* (2013.01); *H01L 2224/05147* (2013.01); *H01L 2224/05166* (2013.01); *H01L 2224/05624* (2013.01); *H01L 2224/05644* (2013.01); *H01L 2224/05647* (2013.01); *H01L 2224/1132* (2013.01); *H01L 2224/1144* (2013.01); *H01L 2224/1145* (2013.01); *H01L 2224/11334* (2013.01); *H01L 2224/11462* (2013.01); *H01L 2224/11849* (2013.01); *H01L 2224/13022* (2013.01); *H01L 2224/13111* (2013.01); *H01L 2224/13139* (2013.01); *H01L 2224/13147* (2013.01); *H01L 2924/01029* (2013.01); *H01L 2924/12042* (2013.01)

(58) Field of Classification Search
CPC ......... H01L 21/76816; H01L 21/76873; H01L 21/2885; H01L 21/7684; H01L 21/76807; H01L 24/05; H01L 24/13; H01L 24/03; H01L 24/11; H01L 2221/1031; H01L 2224/03462; H01L 2224/11334; H01L 2224/13022; H01L 2224/11462; H01L 2224/0401; H01L 2224/03464
See application file for complete search history.

(56) References Cited

U.S. PATENT DOCUMENTS

| | | |
|---|---|---|
| 4,268,601 A | 5/1981 | Namiki et al. |
| 4,289,845 A | 9/1981 | Bowden et al. |
| 4,346,164 A | 8/1982 | Tabarelli et al. |
| 4,491,628 A | 1/1985 | Ito et al. |
| 4,663,275 A | 5/1987 | West et al. |
| 4,777,119 A | 10/1988 | Brault et al. |
| 4,939,070 A | 7/1990 | Brunsvold et al. |
| 5,002,850 A | 3/1991 | Shinozaki et al. |
| 5,268,260 A | 12/1993 | Bantu et al. |
| 5,288,588 A | 2/1994 | Yukawa et al. |
| 5,738,975 A | 4/1998 | Nakano et al. |
| 5,750,312 A | 5/1998 | Chandross et al. |
| 5,766,824 A | 6/1998 | Batchelder et al. |
| 5,856,065 A | 1/1999 | Hagen |
| 5,863,710 A | 1/1999 | Wakiya et al. |
| 5,886,102 A | 3/1999 | Sinta et al. |
| 5,889,141 A | 3/1999 | Marrocco, III et al. |
| 6,008,265 A | 12/1999 | Vallee et al. |
| 6,147,249 A | 11/2000 | Watanabe et al. |
| 6,187,504 B1 | 2/2001 | Suwa et al. |
| 6,306,554 B1 | 10/2001 | Barclay et al. |
| 6,462,426 B1 | 10/2002 | Kelkar et al. |
| 6,627,377 B1 | 9/2003 | Itatani et al. |
| 6,674,162 B2 | 1/2004 | Takao |
| 6,787,289 B2 | 9/2004 | Yamada et al. |
| 6,788,477 B2 | 9/2004 | Lin |
| 6,790,579 B1 | 9/2004 | Goodall et al. |
| 6,835,527 B2 | 12/2004 | Takata et al. |
| 6,852,473 B2 | 2/2005 | Roberts et al. |
| 6,872,503 B2 | 3/2005 | Wheland et al. |
| 6,875,554 B2 | 4/2005 | Hatanaka et al. |
| 6,936,400 B2 | 8/2005 | Takasu et al. |
| 6,952,253 B2 | 10/2005 | Lof et al. |
| 6,991,888 B2 | 1/2006 | Padmanaban et al. |
| 7,195,860 B2 | 3/2007 | Endo et al. |
| 7,235,348 B2 | 6/2007 | Ho et al. |
| 7,264,918 B2 | 9/2007 | Endo et al. |
| 7,312,014 B2 | 12/2007 | Maesawa et al. |
| 7,320,855 B2 | 1/2008 | Huang et al. |
| 7,344,970 B2 | 3/2008 | Forman et al. |
| 7,362,412 B2 | 4/2008 | Holmes et al. |
| 7,393,624 B2 | 7/2008 | Allen et al. |
| 7,432,035 B2 | 10/2008 | Maeda et al. |
| 7,432,042 B2 | 10/2008 | Chang et al. |
| 7,460,206 B2 | 12/2008 | Weissenrieder et al. |
| 7,470,503 B1 | 12/2008 | Brandl |
| 7,582,398 B2 | 9/2009 | Iftime et al. |
| 7,585,612 B2 | 9/2009 | Thackeray et al. |
| 7,595,141 B2 | 9/2009 | Kudo et al. |
| 7,608,386 B2 | 10/2009 | Nozaki et al. |
| 7,648,815 B2 | 1/2010 | Itatani et al. |
| 7,718,541 B2 | 5/2010 | Makiyama et al. |
| 7,733,459 B2 | 6/2010 | Dierichs et al. |
| 7,738,074 B2 | 6/2010 | Streefkerk et al. |
| 7,779,781 B2 | 8/2010 | Mertens et al. |
| 7,824,837 B2 | 11/2010 | Wu et al. |
| 7,846,637 B2 | 12/2010 | Ishizuka et al. |
| 7,879,529 B2 | 2/2011 | Endo et al. |
| 7,919,222 B2 | 4/2011 | Vohra et al. |
| 7,959,141 B2 | 6/2011 | Makino |
| 7,985,534 B2 | 7/2011 | Tsubaki |
| 7,989,578 B2 | 8/2011 | Wu |
| 7,998,655 B2 | 8/2011 | Tsubaki |
| 8,017,304 B2 | 9/2011 | Tarutani et al. |
| 8,071,272 B2 | 12/2011 | Tsubaki |
| 8,088,548 B2 | 1/2012 | Houlihan et al. |
| 8,088,557 B2 | 1/2012 | Tsubaki |
| 8,105,748 B2 | 1/2012 | Ohashi et al. |
| 8,257,901 B2 | 9/2012 | Kim et al. |
| 8,323,870 B2 | 12/2012 | Lee et al. |
| 8,329,387 B2 | 12/2012 | Yao et al. |
| 8,334,338 B2 | 12/2012 | Yoshimura et al. |
| 8,460,856 B2 | 6/2013 | Yeh et al. |
| 8,507,177 B2 | 8/2013 | Wang et al. |
| 8,518,628 B2 | 8/2013 | Chang et al. |
| 8,586,290 B2 | 11/2013 | Wang et al. |
| 2001/0044070 A1 | 11/2001 | Uetani et al. |
| 2002/0015826 A1 | 2/2002 | Desmarteau et al. |
| 2002/0051933 A1 | 5/2002 | Kodama et al. |
| 2002/0068237 A1 | 6/2002 | Imai |
| 2002/0096757 A1 | 7/2002 | Takao et al. |
| 2003/0022097 A1 | 1/2003 | Malik et al. |
| 2003/0073027 A1 | 4/2003 | Namiki et al. |
| 2003/0079764 A1 | 5/2003 | Hirose et al. |
| 2003/0087179 A1 | 5/2003 | Iwasaki |
| 2003/0175624 A1 | 9/2003 | Nozaki et al. |
| 2004/0038520 A1 | 2/2004 | Seto et al. |
| 2004/0084150 A1 | 5/2004 | George et al. |

(56) References Cited

U.S. PATENT DOCUMENTS

| | | |
|---|---|---|
| 2004/0096780 A1 | 5/2004 | Nozaki et al. |
| 2004/0161698 A1 | 8/2004 | Kanagasabapathy et al. |
| 2004/0180299 A1 | 9/2004 | Rolland et al. |
| 2005/0134817 A1 | 6/2005 | Nakamura |
| 2005/0145803 A1 | 7/2005 | Hakey et al. |
| 2005/0145821 A1 | 7/2005 | French et al. |
| 2005/0225737 A1 | 10/2005 | Weissenrieder et al. |
| 2005/0266354 A1 | 12/2005 | Li et al. |
| 2005/0287466 A1 | 12/2005 | Miyamoto et al. |
| 2006/0008736 A1 | 1/2006 | Kanda et al. |
| 2006/0105267 A1 | 5/2006 | Khojasteh et al. |
| 2006/0141400 A1 | 6/2006 | Hirayama et al. |
| 2006/0204890 A1 | 9/2006 | Kodama |
| 2006/0246373 A1 | 11/2006 | Wang |
| 2006/0257781 A1 | 11/2006 | Benoit et al. |
| 2006/0257785 A1 | 11/2006 | Johnson |
| 2007/0031755 A1 | 2/2007 | Hirayama et al. |
| 2007/0207406 A1 | 9/2007 | Guerrero et al. |
| 2008/0113300 A2 | 5/2008 | Choi et al. |
| 2008/0149135 A1 | 6/2008 | Cho et al. |
| 2008/0160729 A1 | 7/2008 | Krueger et al. |
| 2008/0187860 A1 | 8/2008 | Tsubaki et al. |
| 2008/0241778 A1 | 10/2008 | Kulp |
| 2009/0042147 A1 | 2/2009 | Tsubaki |
| 2009/0305163 A1 | 12/2009 | Iwashita et al. |
| 2009/0311624 A1 | 12/2009 | Horiguchi et al. |
| 2010/0040971 A1 | 2/2010 | Tarutani et al. |
| 2010/0239984 A1 | 9/2010 | Tsubaki |
| 2010/0276186 A1* | 11/2010 | Sasaki .................. G03F 7/0233 174/258 |
| 2011/0020755 A1 | 1/2011 | Tsubaki |
| 2011/0097670 A1 | 4/2011 | Wang et al. |
| 2011/0250543 A1 | 10/2011 | Tsubaki |
| 2011/0263136 A1 | 10/2011 | Kim et al. |
| 2012/0052687 A1 | 3/2012 | Raghavan et al. |
| 2012/0171616 A1 | 7/2012 | Thackeray et al. |
| 2012/0238106 A1 | 9/2012 | Chuang |
| 2012/0282553 A1 | 11/2012 | Kimura et al. |
| 2012/0308741 A1 | 12/2012 | Kim et al. |
| 2012/0308939 A1 | 12/2012 | Kudo et al. |
| 2013/0228897 A1 | 9/2013 | Chen et al. |
| 2014/0011133 A1 | 1/2014 | Liu et al. |

FOREIGN PATENT DOCUMENTS

| | | |
|---|---|---|
| TW | I336819 B | 2/2011 |
| TW | I341961 B | 5/2011 |
| TW | I343513 B | 6/2011 |
| WO | 2005088397 A2 | 9/2005 |
| WO | 2006054432 A1 | 5/2006 |

OTHER PUBLICATIONS

Kitano, Junichi et al., "Resist pattern collapse prevention for the sub-90nm node," Microlithography World, May 2004, pp. 18-24, PennWell Publishing Corp.

Kunz, Roderick R., Kunz SPIE Short Course, 21 pages, MIT Lincoln Library, 2002, publisher unknown.

Lau, Aldrich N. K. et al., "New Thermal Cross-Linkers Based on Triazene: Cross-Linking of Fluorinated Polyimides and Aromatic Polymers," Macromolecules, 1992, pp. 7294-7299, vol. 25.

Reiser, Arnost, "Photoreactive Polymers: The Science and Technology of Resists," Feb. 1989, 409 pages, Wiley-Interscience, New York.

Robertson, Stewart et al., "Physical Resist Simulation for a Negative Tone Development Process," 2010 International Symposium on Lithography Extension, Oct. 20-22, 2010, 19 pages.

Sekiguchi, Atsushi et al., "Analysis of Deprotection Reaction in Chemically Amplified Resists Using an Fourier Transform Infrared Spectrometer with an Exposure Tool," Japan J. Appl. Phys., Mar. 2000, pp. 1392-1398, vol. 39, Part 1, No. 3A.

Switkes, M. et al., "Extending optics to 50 nm and beyond with immersion lithography," Journal of Vacuum Science & Technology B: Microelectronics and Nanometer Structures, Nov./Dec. 2003, vol. 21, No. 6., pp. 2794-2799.

Tarutani, Shinji et al., "Process parameter influence to negative tone development process for double patterning," Proc. SPIE 7639, Advances in Resist Materials and Processing Technology XXVII, Mar. 29, 2010, 13 pages, vol. 7639.

Tsvetanova, D. et al., "Degradation of 248 nm Deep UV Photoresist by Ion Implantation," Journal of The Electromechanical Society, Jun. 10, 2011, 10 pages, vol. 158, Issue 8, The Electromechanical Society.

\* cited by examiner

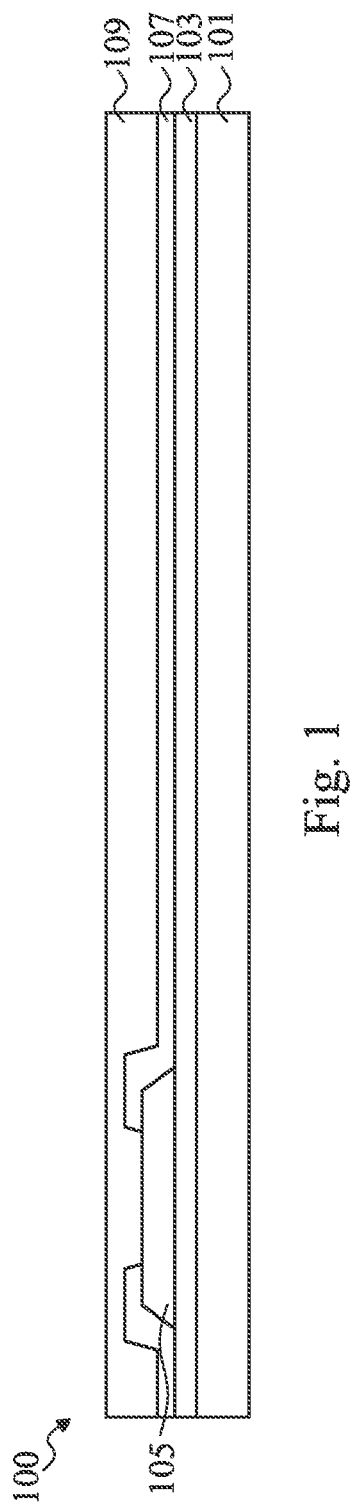

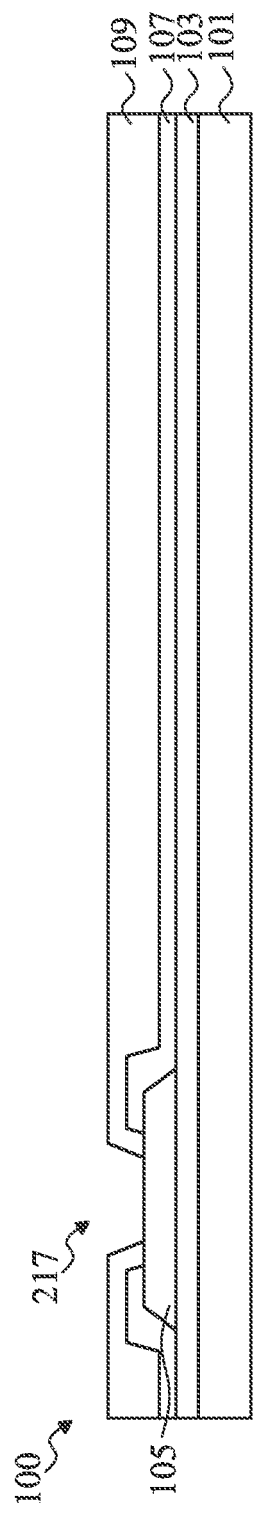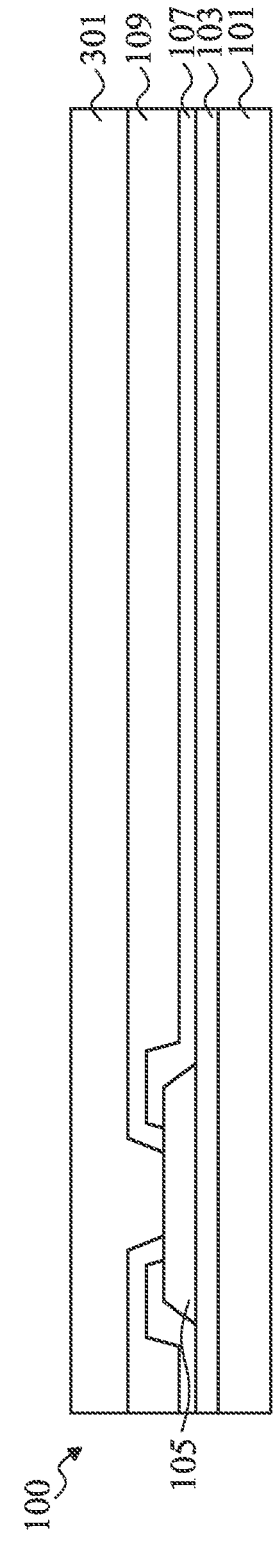

US 10,269,675 B2

CONDUCTIVE LINE SYSTEM AND PROCESS

This application is a continuation of and claims the benefit of U.S. patent application Ser. No. 15/180,372, filed on Jun. 13, 2016, and entitled, "Conductive Line System and Process," which is a continuation of Ser. No. 14/833,760, filed on Aug. 24, 2015, and entitled "Conductive Line System Process," now U.S. Pat. No. 9,368,402 issued on Jun. 14, 2016, which is a division of U.S. patent application Ser. No. 13/929,641, filed on Jun. 27, 2013 and entitled "Conductive Line System and Process," now U.S. Pat. No. 9,117,881 issued on Aug. 25, 2015, which claims priority to U.S. Provisional Application No. 61/789,593, filed on Mar. 15, 2013, and entitled "Conductive Line System and Process," which applications are incorporated herein by reference.

BACKGROUND

Generally, active devices and passive devices are formed on and in a semiconductor substrate. Once formed, these active devices and passive devices may be connected to each other and to external devices using a series of conductive and insulative layers. These layers may help to interconnect the various active devices and passive devices as well as provide an electrical connection to external devices through, for example, a contact pad. To provide additional flexibility to designs, a post-passivation interconnect may be utilized to position external contacts where desired after the contact pad has been formed and after passivation layers have been formed over the contact pad.

BRIEF DESCRIPTION OF THE DRAWINGS

For a more complete understanding of the embodiments, and the advantages thereof, reference is now made to the following descriptions taken in conjunction with the accompanying drawings, in which:

FIG. 1 illustrates a cross-sectional view of a substrate with a second passivation layer over a contact pad in accordance with an embodiment;

FIGS. 2A-2B illustrate a patterning and development of the second passivation layer in accordance with an embodiment;

FIG. 3 illustrates a placement of a third passivation layer in accordance with an embodiment;

Corresponding numerals and symbols in the different figures generally refer to corresponding parts unless otherwise indicated. The figures are drawn to clearly illustrate the relevant aspects of the embodiments and are not necessarily drawn to scale

DETAILED DESCRIPTION OF ILLUSTRATIVE EMBODIMENTS

Figure 2A:
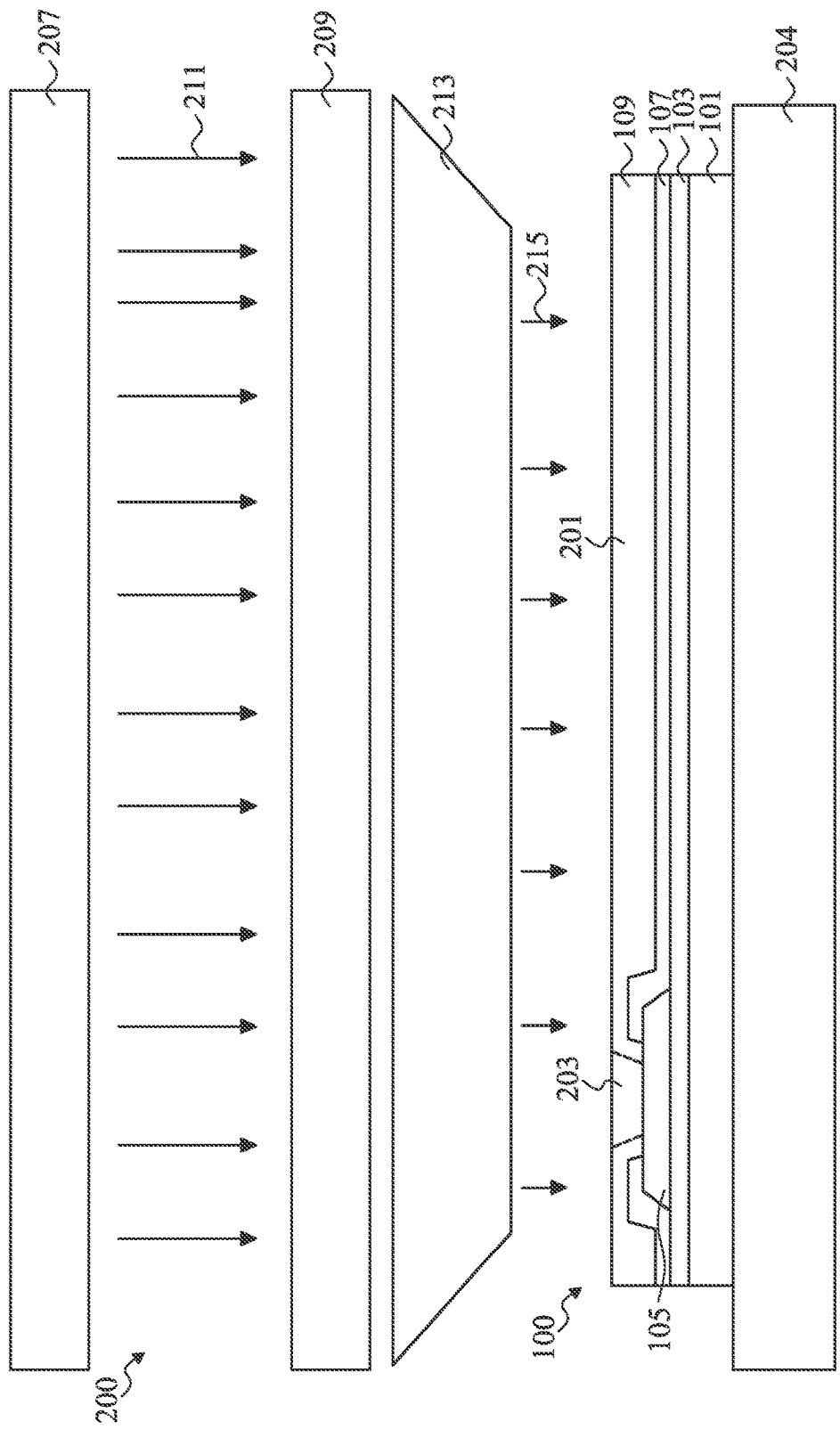

The making and using of the present embodiments are discussed in detail below. It should be appreciated, however, that the embodiments provide many applicable inventive concepts that can be embodied in a wide variety of specific contexts. The embodiments discussed are merely illustrative of specific ways to make and use the embodiments, and do not limit the scope of the embodiments.

The embodiments will be described with respect to embodiments in a specific context, namely an interconnect structure formed after passivation using a process similar to a dual damascene process. The embodiments may also be applied, however, to other interconnect structures.

With reference now to FIG. 1, there is shown a portion of a semiconductor die 100 including a semiconductor substrate 101 with metallization layers 103, a contact pad 105, a first passivation layer 107, and a second passivation layer 109. The semiconductor substrate 101 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

Active devices (not shown) may be formed on the semiconductor substrate 101. As one of ordinary skill in the art will recognize, a wide variety of active devices such as capacitors, resistors, inductors and the like may be used to generate the desired structural and functional requirements of the design for the semiconductor die 100. The active devices may be formed using any suitable methods either within or else on the surface of the semiconductor substrate 101.

The metallization layers 103 are formed over the semiconductor substrate 101 and the active devices and are designed to connect the various active devices to form functional circuitry. While illustrated in FIG. 1 as a single layer, the metallization layers 103 may be formed of alternating layers of dielectric (e.g., low-k dielectric material) and conductive material (e.g., copper) and may be formed through any suitable process (such as deposition, damascene, dual damascene, etc.). In an embodiment there may be four layers of metallization separated from the semiconductor substrate 101 by at least one interlayer dielectric layer (ILD), but the precise number of metallization layers 103 is dependent upon the design of the semiconductor die 100.

The contact pad 105 may be formed over and in electrical contact with the metallization layers 103. The contact pad 105 may comprise aluminum, but other materials, such as copper, may alternatively be used. The contact pad 105 may be formed using a deposition process, such as sputtering, to form a layer of material (not shown) and portions of the layer of material may then be removed through a suitable process (such as photolithographic masking and etching) to form the contact pad 105. However, any other suitable process may be utilized to form the contact pad 105. The contact pad 105 may be formed to have a thickness of between about 0.5 μm and about 4 μm, such as about 1.45 μm.

The first passivation layer 107 may be formed on the semiconductor substrate 101 over the metallization layers 103 and the contact pad 105. The first passivation layer 107 may be made of one or more suitable dielectric materials such as silicon oxide, silicon nitride, low-k dielectrics such as carbon doped oxides, extremely low-k dielectrics such as porous carbon doped silicon dioxide, combinations of these, or the like. The first passivation layer 107 may be formed through a process such as chemical vapor deposition (CVD), although any suitable process may be utilized, and may have a thickness between about 0.5 μm and about 5 μm, such as about 9.25 KÅ.

After the first passivation layer 107 has been formed, an opening may be made through the first passivation layer 107 by removing portions of the first passivation layer 107 to expose at least a portion of the underlying contact pad 105. The opening allows for contact between the contact pad 105 and a PPI 803 (not illustrated in FIG. 1 but illustrated and discussed further below with respect to FIG. 8). The opening may be formed using a suitable photolithographic mask and etching process, although any suitable process to expose portions of the contact pad 105 may be used.

The second passivation layer 109 may be formed over the first passivation layer 107 and in the opening to contact the contact pad 105. In an embodiment the second passivation layer 109 may comprise, for example, a negative tone photosensitive composition such as a negative tone photosensitive polyimide composition. For example, such a negative tone photosensitive polyimide composition in the second passivation layer 109 may comprise a negative tone photosensitive polyimide resin along with a photoactive components (PACs) placed into a negative tone photosensitive polyimide solvent.

In an embodiment the negative tone photosensitive polyimide resin may comprise a polymer that is made up of monomers of the following formula:

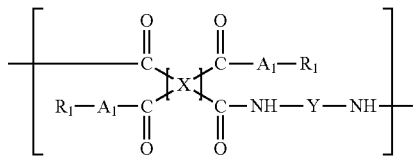

where X is a tetravalent organic group derived from alicyclic tetracarboxylic acid dianhydrides having 3 to 30 carbon atoms; $A_1$ is an oxygen atom or an NH group; and Y is a di-valent organic group derived from aliphatic, alicyclic, or non-conjugated aromatic diamines with carbon atoms between 3 and 30, wherein side chains have one or more ethylenically unsaturated, cross-linkable bonds. $R_1$ is a hydrogen atom or an organic group having 1 to 20 carbon atoms including one or more ethylenically unsaturated bonds or, alternatively, is a group comprising a photopolymerizable olefin double bond. In a particular embodiment $R_1$ may comprise the following structure:

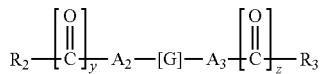

where $R_2$ is an aryl residue such as $C_2H_3$ or $C_3H_5$, $R_3$ is a residue with at least one photopolymerizable olefin double bond, G is a divalent aliphatic or aromatic group, which may be unsubstituted or has one or more hydroxyl substituents, $A_2$ is an oxygen atom or an NR group, in which R indicates a hydrogen atom or a $C_1$-$C_4$ alkyl group, $A_3$ is an oxygen atom or an NR group, in which R indicates a hydrogen atom or a $C_1$-$C_4$ alkyl group, y is 0 or 1 and z is 0 or 1.

Additionally, while the negative tone photosensitive polyimide resin may be one of the embodiments as described above, the negative tone photosensitive polyimide resin is not intended to be limited to only the specific examples described herein. Rather, any suitable negative tone photosensitive polyimide resin may alternatively be utilized, and all such photosensitive polyimide resins are fully intended to be included within the scope of the embodiments.

The PACs may be photoactive components such as photoacid generators, photobase generators, free-radical generators, or the like, and the PACs may be positive-acting or negative-acting. In an embodiment in which the PACs are a photoacid generator, the PACs may comprise halogenated triazines, onium salts, diazonium salts, aromatic diazonium salts, phosphonium salts, sulfonium salts, iodonium salts, imide sulfonate, oxime sulfonate, disulfone, o-nitrobenzylsulfonate, sulfonated esters, halogenerated sulfonyloxy dicarboximides, diazodisulfones, α-cyanooxyamine-sulfonates, imidesulfonates, ketodiazosulfones, sulfonyldiazoesters, 1,2-di(arylsulfonyl)hydrazines, nitrobenzyl esters, and the s-triazine derivatives, suitable combinations of these, and the like.

Specific examples of photoacid generators that may be used include α-(trifluoromethylsulfonyloxy)-bicyclo[2.2.1] hept-5-ene-2,3-dicarboximide (MDT), N-hydroxy-naphthalimide (DDSN), benzoin tosylate, t-butylphenyl-α-(p-toluenesulfonyloxy)-acetate and t-butyl-α-(p-toluenesulfonyloxy)-acetate, triarylsulfonium and diaryliodonium hexafluoroantimonates, hexafluoroarsenates, trifluoromethanesulfonates, iodonium perfluorooctanesulfonate, N-camphorsulfonyloxynaphthalimide, N-pentafluorophenylsulfonyloxynaphthalimide, ionic iodonium sulfonates such as diaryl iodonium (alkyl or aryl) sulfonate and bis-(di-t-butylphenyl)iodonium camphanylsulfonate, perfluoroalkanesulfonates such as perfluoropentanesulfonate, perfluorooctanesulfonate, perfluoromethanesulfonate, aryl (e.g., phenyl or benzyl) triflates such as triphenylsulfonium triflate or bis-(t-butylphenyl)iodonium triflate; pyrogallol derivatives (e.g., trimesylate of pyrogallol), trifluoromethanesulfonate esters of hydroxyimides, α,α'-bis-sulfonyl-diazomethanes, sulfonate esters of nitro-substituted benzyl alcohols, naphthoquinone-4-diazides, alkyl disulfones, and the like.

In an embodiment in which the PACs are a free-radical generator, the PACs may comprise n-phenylglycine, aromatic ketones such as benzophenone, N,N'-tetramethyl-4,4'-diaminobenzophenone, N,N'-tetraethyl-4,4'-diaminobenzophenone, 4-methoxy-4'-dimethylaminobenzophenone, 3,3'-dimethyl-4-methoxybenzophenone, p,p'-bis (dimethylamino)benzophenone, p,p'-bis(diethylamino)-benzophenone, anthraquinone, 2-ethylanthraquinone, naphthaquinone and phenanthraquinone, benzoins such as benzoin, benzoinmethylether, benzoinethylether, benzoinisopropylether, benzoin-n-butylether, benzoin-phenylether, methylbenzoin and ethybenzoin, benzyl derivatives such as dibenzyl, benzyldiphenyldisulfide and benzyldimethylketal, acridine derivatives such as 9-phenylacridine and 1,7-bis(9-acridinyl)heptane, thioxanthones such as 2-chlorothioxanthone, 2-methylthioxanthone, 2,4-diethylthioxanthone, 2,4-dimethylthioxanthone and 2-isopropylthioxanthone, acetophenones such as 1,1-dichloroacetophenone, p-t-butyldichloro-acetophenone, 2,2-diethoxyacetophenone, 2,2-dimethoxy-2-phenylacetophenone, and 2,2-dichloro-4-phenoxyacetophenone, 2,4,5-triarylimidazole dimers such as 2-(o-chlorophenyl)-4,5-diphenylimidazole dimer, 2-(o-chlorophenyl)-4,5-di-(m-methoxyphenyl imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer, 2,4-di(p-methoxyphenyl)-5-phenylimidazole dimer, 2-(2,4-dimethoxyphenyl)-4,5-diphenylimidazole dimer and 2-(p- methylmercaptophenyl)-4,5-diphenylimidazole dimer, suitable combinations of these, or the like.

In an embodiment in which the PACs are a photobase generator, the PACs may comprise quaternary ammonium dithiocarbamates, α aminoketones, oxime-urethane containing molecules such as dibenzophenoneoxime hexamethylene diurethan, ammonium tetraorganylborate salts, and N-(2-nitrobenzyloxycarbonyl) cyclic amines, suitable combinations of these, or the like. However, as one of ordinary skill in the art will recognize, the chemical compounds listed herein are merely intended as illustrated examples of the PACs and are not intended to limit the embodiments to only those PACs specifically described. Rather, any suitable PAC may alternatively be utilized, and all such PACs are fully intended to be included within the scope of the present embodiments.

In an embodiment the negative tone photosensitive polyimide solvent may be an organic solvent, and may comprise any suitable solvent such as ketones, alcohols, polyalcohols, ethers, glycol ethers, cyclic ethers, aromatic hydrocarbons, esters, propionates, lactates, lactic esters, alkylene glycol monoalkyl ethers, alkyl lactates, alkyl alkoxypropionates, cyclic lactones, monoketone compounds that contain a ring, alkylene carbonates, alkyl alkoxyacetate, alkyl pyruvates, ethylene glycol alkyl ether acetates, diethylene glycols, propylene glycol alkyl ether acetates, alkylene glycol alkyl ether esters, alkylene glycol monoalkyl esters, or the like.

Specific examples of materials that may be used as the negative tone photosensitive polyimide solvent for the negative tone photosensitive polyimide composition include acetone, methanol, ethanol, toluene, xylene, 4-hydroxy-4-methyl-2-pentatone, tetrahydrofuran, methyl ethyl ketone, cyclohexanone, methyl isoamyl ketone, 2-heptanone, ethylene glycol, ethylene glycol monoacetate, ethylene glycol dimethyl ether, ethylene glycol methylethyl ether, ethylene glycol monoethyl ether, methyl celluslve acetate, ethyl cellosolve acetate, diethylene glycol, diethylene glycol monoacetate, diethylene glycol monomethyl ether, diethylene glycol diethyl ether, diethylene glycol dimethyl ether, diethylene glycol ethylmethyl ether, diethylene glycol monoethyl ether, diethylene glycol monobutyl ether, ethyl 2-hydroxypropionate, methyl 2-hydroxy-2-methylpropionate, ethyl 2-hydroxy-2-methylpropionate, ethyl ethoxyacetate, ethyl hydroxyacetate, methyl 2-hydroxy-2-methylbutanate, methyl 3-methoxypropionate, ethyl 3-methoxypropionate, methyl 3-ethoxypropionate, ethyl 3-ethoxypropionate, ethyl acetate, butyl acetate, methyl lactate and ethyl lactate, propylene glycol, propylene glycol monoacetate, propylene glycol monoethyl ether acetate, propylene glycol monomethyl ether acetate, propylene glycol monopropyl methyl ether acetate, propylene glycol monobutyl ether acetate, propylene glycol monobutyl ether acetate, propylene glycol monomethyl ether propionate, propylene glycol monoethyl ether propionate, propylene glycol methyl ether adcetate, proplylene glycol ethyl ether acetate, ethylene glycol monomethyl ether acetate, ethylene glycol monoethyl ether acetate, propylene glycol monomethyl ether, propylene glycol monoethyl ether, propylene glycol monopropyl ether, propylene glycol monobutyl ether, ethylene glycol monomethyl ether, ethylene glycol monoethyl ether, propyl lactate, and butyl lactate, ethyl 3-ethoxypropionate, methyl 3-methoxypropionate, methyl 3-ethoxypropionate, and ethyl 3-methoxypropionate, β-propiolactone, β-butyrolactone, γ-butyrolactone, α-methyl-γ-butyrolactone, β-methyl-γ-butyrolactone, γ-valerolactone, γ-caprolactone, γ-octanoic lactone, α-hydroxy-γ-butyrolactone, 2-butanone, 3-methylbutanone, pinacolone, 2-pentanone, 3-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexene-2-one, 3-pentene-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone, 3-methylcycloheptanone, pylene carbonate, vinylene carbonate, ethylene carbonate, and butylene carbonate, acetate-2-methoxyethyl, acetate-2-ethoxyethyl, acetate-2-(2-ethoxyethoxy)ethyl, acetate-3-methoxy-3-methylbutyl, acetate-1-methoxy-2-propyl, dipropylene glycol, monomethylether, monoethylether, monopropylether, monobutylehter, monophenylether, dipropylene glycol monoacetate, dioxane, etheyl lactate, methyl acetate, ethyl acetate, butyl acetate, methyl puruvate, ethyl puruvate, propyl pyruvate, methyl methoxypropionate, ethyl ethoxypropionate, n-methylpyrrolidone (NMP), 2-methoxyethyl ether (diglyme), ethylene glycol monom-ethyl ether, propylene glycol monomethyl ether; methyl proponiate, ethyl proponiate and ethyl ethoxy proponiate, methylethyl ketone, cyclohexanone, 2-heptanone, carbon dioxide, cyclopentatone, cyclohexanone, ethyl 3-ethocypropionate, propylene glycol methyl ether acetate (PGMEA), methylene cellosolve, butyle acetate, and 2-ethoxyethanol, N-methylformamide, N,N-dimethylformamide, N-methylformanilide, N-methylacetamide, N,N-dimethylacetamide, N-methylpyrrolidone, dimethylsulfoxide, benzyl ethyl ether, dihexyl ether, acetonylacetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate, phenyl cellosolve acetate, or the like.

In an embodiment the negative tone photosensitive polyimide resin and the PACs, along with any desired additives or other agents, are added to the negative tone photosensitive polyimide solvent for application. For example, the negative tone photosensitive polyimide resin may have a concentration of between about 5% and about 50%, such as about 25%, while the PACs may have a concentration of between about 0.1% and about 20%, such as about 5%. Once added, the mixture is then mixed in order to achieve an even composition throughout the negative tone photosensitive polyimide composition in order to ensure that there are no defects caused by an uneven mixing or non-constant composition. Once mixed together, the negative tone photosensitive polyimide composition may either be stored prior to its usage or else used immediately.

Once ready, the second passivation layer 109 may be utilized by initially applying the negative tone photosensitive polyimide composition onto the first passivation layer 107. The second passivation layer 109 may be applied to the first passivation layer 107 so that the second passivation layer 109 coats an upper exposed surface of the first passivation layer 107, and may be applied using a process such as a spin-on coating process, a dip coating method, an air-knife coating method, a curtain coating method, a wire-bar coating method, a gravure coating method, a lamination method, an extrusion coating method, combinations of these, or the like. The second passivation layer 109 may be placed to a thickness of between about 1 µm to about 40 µm.

FIGS. 2A-2B illustrate a patterning and development of the second passivation layer 109. Once applied, the second passivation layer 109 may be exposed to form an exposed region 201 and an unexposed region 203 within the second passivation layer 109. In an embodiment the exposure may be initiated by placing the substrate 101 and the second passivation layer 109 into an imaging device 200 for exposure. The imaging device 200 may comprise a support plate 204, a energy source 207, a patterned mask 209 between the support plate 204 and the energy source 207, and optics 213. In an embodiment the support plate 204 is a surface to which the semiconductor device 100 and the second passivation layer 109 may be placed or attached to and which provides support and control to the substrate 101 during exposure of the second passivation layer 109. Additionally, the support plate 204 may be movable along one or more axes, as well as providing any desired heating or cooling to the substrate 101 and second passivation layer 109 in order to prevent temperature gradients from affecting the exposure process.

In an embodiment the energy source 207 supplies energy 211 such as light to the second passivation layer 109 in order to induce a reaction of the PACs, which in turn reacts with, e.g., the negative tone photosensitive polyimide resin to chemically alter those portions of the second passivation layer 109 to which the energy 211 impinges. In an embodiment the energy 211 may be electromagnetic radiation, such as g-rays (with a wavelength of about 436 nm), i-rays (with a wavelength of about 365 nm), ultraviolet radiation, far ultraviolet radiation, x-rays, electron beams, or the like. The energy source 207 may be a source of the electromagnetic radiation, and may be a KrF excimer laser light (with a wavelength of 248 nm), an ArF excimer laser light (with a wavelength of 193 nm), a $F_2$ excimer laser light (with a wavelength of 157 nm), or the like, although any other suitable source of energy 211, such as mercury vapor lamps, xenon lamps, carbon arc lamps or the like, may alternatively be utilized.

The patterned mask 209 is located between the energy source 207 and the second passivation layer 109 in order to block portions of the energy 211 to form a patterned energy 215 prior to the energy 211 actually impinging upon the second passivation layer 109. In an embodiment the patterned mask 209 may comprise a series of layers (e.g., substrate, absorbance layers, anti-reflective coating layers, shielding layers, etc.) to reflect, absorb, or otherwise block portions of the energy 211 from reaching those portions of the second passivation layer 109 which are not desired to be illuminated. The desired pattern may be formed in the patterned mask 209 by forming openings through the patterned mask 209 in the desired shape of illumination.

Optics (represented in FIG. 2A by the trapezoid labeled 213) may be used to concentrate, expand, reflect, or otherwise control the energy 211 as it leaves the energy source 207, is patterned by the patterned mask 209, and is directed towards the second passivation layer 109. In an embodiment the optics 213 comprise one or more lenses, mirrors, filters, combinations of these, or the like to control the energy 211 along its path. Additionally, while the optics 213 are illustrated in FIG. 2A as being between the patterned mask 209 and the second passivation layer 109, elements of the optics 213 (e.g., individual lenses, mirrors, etc.) may also be located at any location between the energy source 207 (where the energy 211 is generated) and the second passivation layer 109.

In an embodiment the semiconductor device 100 with the second passivation layer 109 is placed on the support plate 204. Once the pattern has been aligned to the semiconductor device 100, the energy source 207 generates the desired energy 211 (e.g., light) which passes through the patterned mask 209 and the optics 213 on its way to the second passivation layer 109. The patterned energy 215 impinging upon portions of the second passivation layer 109 induces a reaction of the PACs within the second passivation layer 109. The chemical reaction products of the PACs' absorption of the patterned energy 215 (e.g., acids/bases/free radicals) then reacts, chemically altering the second passivation layer 109 in those portions that were illuminated through the patterned mask 209.

Optionally, the exposure of the second passivation layer 109 may occur using an immersion lithography technique. In such a technique an immersion medium (not individually illustrated in FIG. 2A) may be placed between the imaging device 200 (and particularly between a final lens of the optics 213) and the second passivation layer 109. With this immersion medium in place, the second passivation layer 109 may be patterned with the patterned energy 215 passing through the immersion medium.

In this embodiment a protective layer (also not individually illustrated in FIG. 2A) may be formed over the second passivation layer 109 in order to prevent the immersion medium from coming into direct contact with the second passivation layer 109 and leaching or otherwise adversely affecting the second passivation layer 109. In an embodiment the protective layer is insoluble within the immersion medium such that the immersion medium will not dissolve it and is immiscible in the second passivation layer 109 such that the protective layer will not adversely affect the second passivation layer 109. Additionally, the protective layer is transparent so that the patterned energy 215 may pass through the protective layer without hindrance.

In an embodiment the protective layer comprises a protective layer resin within a protective layer solvent. The material used for the protective layer solvent is, at least in part, dependent upon the components chosen for the second passivation layer 109, as the protective layer solvent should not dissolve the materials of the second passivation layer 109 so as to avoid degradation of the second passivation layer 109 during application and use of the protective layer. In an embodiment the protective layer solvent includes alcohol solvents, fluorinated solvents, and hydrocarbon solvents.

Specific examples of materials that may be utilized for the protective layer solvent include methanol, ethanol, 1-propanol, isopropanol, n-propanol, 1-butanol, 2-butanol, 2-methyl-2-propanol, 3-methyl-1-butanol, isobutyl alcohol, tert-butyl alcohol, 1-pentanol, 2-pentanol, 3-pentanol, n-hexanol, cyclohecanol, 1-hexanol, 1-heptanol, 1-octanol, 2-hexanol, 2-heptanol, 2-octanol, 3-hexanol, 3-heptanol, 3-octanol, 4-octanol, 2-methyl-2-butanol, 3-methyl-1-butanol, 3-methyl-2-butanol, 2-methyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 2,2,3,3,4,4-hexafluoro-1-butanol, 2,2,3,3,4,4,5,5-octafluoro-1-pentanol, 2,2,3,3,4,4,5,5,6,6-decafluoro-1-hexanol, 2,2,3,3,4,4-hexafluoro-1,5-pentanediol, 2,2,3,3,4,4,5,5-octafluoro-1,6-hexanediol, 2,2,3,3,4,4,5,5,6,6,7,7-dodecafluoro-1,8-diol, 2-fluoroanisole, 2,3-difluoroanisole, perfluorohexane, perfluoroheptane, perfluoro-2-pentanone, perfluoro-2-butyltetrahydrofuran, perfluorotetrahydrofuran, perfluorotributylamine, perfluorotetrapentylamine, toluene, xylene and anisole, and aliphatic hydrocarbon solvents, such as n-heptane, n-nonane, n-octane, n-decane, 2-methylheptane, 3-methylheptane, 3,3-dimethylhexane, 2,3,4-trimethylpentane, combinations of these, or the like.

The protective layer resin may comprise a protective layer repeating unit. In an embodiment the protective layer repeating unit may be an acrylic resin with a repeating hydrocarbon structure having a carboxyl group, an alicyclic structure, an alkyl group having one to five carbon atoms, a phenol group, or a fluorine atom-containing group. Specific examples of the alicyclic structure include a cyclohexyl group, an adamantyl group, a norbornyl group, a isobornyl group, a tricyclodecyl group, a tetracyclododecyl group, and the like. Specific examples of the alkyl group include an n-butyl group, an isobutyl group, or the like. However, any suitable protective layer resin may alternatively be utilized.

The protective layer composition may also include additional additives to assist in such things as adhesion, surface leveling, coating, and the like. For example, the protective layer composition may further comprise a protective layer surfactant, although other additives may also be added, and all such additions are fully intended to be included within the scope of the embodiment. In an embodiment the protective layer surfactant may be an alkyl cationic surfactant, an amide-type quaternary cationic surfactant, an ester-type quaternary cationic surfactant, an amine oxide surfactant, a betaine surfactant, an alkoxylate surfactant, a fatty acid ester surfactant, an amide surfactant, an alcohol surfactant, an ethylenediamine surfactant, or a fluorine- and/or silicon-containing surfactant.

Specific examples of materials that may be used for the protective layer surfactant include polyoxyethylene alkyl ethers, such as polyoxyethylene lauryl ether, polyoxyethylene stearyl ether, polyoxyethylene cetyl ether and polyoxyethylene oleyl ether; polyoxyethylene alkyl aryl ethers, such as polyoxyethylene octyl phenol ether and polyoxyethylene nonyl phenol ether; polyoxyethylene-polyooxypropylene block copolymers; sorbitan fatty acid esters, such as sorbitan monolaurate, sorbitan monopalmitate, sorbitan monostearate, sorbitan monooleate, sorbitan trioleate and sorbitan tristearate; and polyoxyethylene sorbitan monolaurate, polyoxyethylene sorbitan monopalmitate, polyoxyethylene sorbitan monostearate, polyoxyethylene sorbitan trioleate and polyoxyethylene sorbitan tristearate.

Prior to application of the protective layer onto the second passivation layer 109, the protective layer resin and desired additives are first added to the protective layer solvent to form a protective layer composition. The protective layer solvent is then mixed to ensure that the protective layer composition has a consistent concentration throughout the protective layer composition.

Once the protective layer composition is ready for application, the protective layer composition may be applied over the second passivation layer 109. In an embodiment the application may be performed using a process such as a spin-on coating process, a dip coating method, an air-knife coating method, a curtain coating method, a wire-bar coating method, a gravure coating method, a lamination method, an extrusion coating method, combinations of these, or the like. In an embodiment the second passivation layer 109 may be applied such that it has a thickness over the surface of the second passivation layer 109 of about 100 nm.

After the protective layer composition has been applied to the second passivation layer 109, a protective layer pre-bake may be performed in order to remove the protective layer solvent. In an embodiment the protective layer pre-bake may be performed at a temperature suitable to evaporate the protective layer solvent, such as between about 40° C. and 150° C., although the precise temperature depends upon the materials chosen for the protective layer composition. The protective layer pre-bake is performed for a time sufficient to cure and dry the protective layer composition, such as between about 10 seconds to about 5 minutes, such as about 90 seconds.

Once the protective layer has been placed over the second passivation layer 109, the semiconductor device 100 with the second passivation layer 109 and the protective layer are placed on the support plate 204, and the immersion medium may be placed between the protective layer and the optics 213. In an embodiment the immersion medium is a liquid having a refractive index greater than that of the surrounding atmosphere, such as having a refractive index greater than 1. Examples of the immersion medium may include water, oil, glycerine, glycerol, cycloalkanols, or the like, although any suitable medium may alternatively be utilized.

The placement of the immersion medium between the protective layer and the optics 213 may be done using, e.g., an air knife method, whereby fresh immersion medium is applied to a region between the protective layer and the optics 213 and controlled using pressurized gas directed towards the protective layer to form a barrier and keep the immersion medium from spreading. In this embodiment the immersion medium may be applied, used, and removed from the protective layer for recycling so that there is fresh immersion medium used for the actual imaging process.

However, the air knife method described above is not the only method by which the second passivation layer 109 may be exposed using an immersion method. Any other suitable method for imaging the second passivation layer 109 using an immersion medium, such as immersing the entire substrate 101 along with the second passivation layer 109 and the protective layer, using solid barriers instead of gaseous barriers, or using an immersion medium without a protective layer, may also be utilized. Any suitable method for exposing the second passivation layer 109 through the immersion medium may be used, and all such methods are fully intended to be included within the scope of the embodiments.

FIG. 2B illustrates a development of the second passivation layer 109 with the use of a developer after the second passivation layer 109 has been exposed. After the second passivation layer 109 has been exposed, the second passivation layer 109 may be developed using a first developer. In an embodiment in which the second passivation layer 109 is the negative tone photosensitive polyimide, the first developer may be a basic aqueous solution to remove those portions of the second passivation layer 109 which were unexposed to the patterned energy 215. Such basic aqueous solutions may include tetra methyl ammonium hydroxide (TMAH), tetra butyl ammonium hydroxide, sodium hydroxide, potassium hydroxide, sodium carbonate, sodium bicarbonate, sodium silicate, sodium metasilicate, aqueous ammonia, monomethylamine, dimethylamine, trimethylamine, monoethylamine, diethylamine, triethylamine, monoisopropylamine, diisopropylamine, triisopropylamine, monobutylamine, dibutylamine, monoethanolamine, diethanolamine, triethanolamine, dimethylaminoethanol, diethylaminoethanol, potassium metasilicate, sodium carbonate, tetraethylammonium hydroxide, combinations of these, or the like.

In an embodiment in which immersion lithography is utilized to expose the second passivation layer 109 and a protective layer is utilized to protect the second passivation layer 109 from the immersion medium, the developer may be chosen to remove not only those portions of the second passivation layer 109 that are desired to be removed, but may also be chosen to remove the protective layer in the same development step. Alternatively, the protective layer may be removed in a separate process, such as by a separate solvent from the developer or even an etching process to remove the protective layer from the second passivation layer 109 prior to development.

The first developer may be applied to the second passivation layer 109 using, e.g., a spin-on process. In this process the first developer is applied to the second passivation layer 109 from above the second passivation layer 109 while the semiconductor device 100 (and the second passivation layer 109) is rotated. In an embodiment the first developer may be at a temperature of between about 10° C. and about 80° C., such as about 50° C., and the development may continue for between about 1 minute to about 60 minutes, such as about 30 minutes.

However, while the spin-on method described herein is one suitable method for developing the second passivation layer 109 after exposure, it is intended to be illustrative and is not intended to limit the embodiments. Rather, any suitable method for development, including dip processes, puddle processes, spray-on processes, combinations of these, or the like, may alternatively be used. All such development processes are fully intended to be included within the scope of the embodiments.

FIG. 2B illustrates a cross-section of the development process in an embodiment in which the first developer is used to remove the unexposed regions of the second passivation layer 109. The developer is applied to the second passivation layer 109 and dissolves the unexposed portion 205 of the second passivation layer 109. This dissolving and removing of the unexposed portion 205 of the second passivation layer 109 leaves behind a first opening 217 within the second passivation layer 109 that patterns the second passivation layer 109 in the shape of the patterned energy 215, thereby transferring the pattern of the patterned mask 209 to the second passivation layer 109. In an embodiment the first opening 217 may have a width of between about 2 μm to about 300 μm, such as about 5 μm to about 300 μm, and may be any desired shape such as round, oval, or polygonal.

FIG. 3 illustrates the placement of a third passivation layer 301 over the second passivation layer 109. In an embodiment the third passivation layer 301 may be a positive tone composition such as a positive tone photosensitive polyimide composition (instead of the negative tone photosensitive polyimide composition described above with respect to the second passivation layer 109). For example, the positive tone photosensitive polyimide composition may comprise a positive tone photosensitive polyimide resin along with the PACs within a positive tone photosensitive polyimide solvent. In an embodiment the positive tone photosensitive polyimide resin may be a polymer with a repeating unit represented by the following formula:

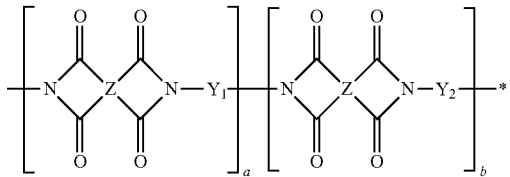

where Z is a tetravalent organic group derived from one or more tetracarboxylic acids, including 3,4-dicarboxy-1,2,3, 4-tetrahydro-6-tert-butyl-1-naphthalene succinic dianhydride (DTBDA), or derivatives thereof, a is from 1 to 150, b is from 1 to 400, $Y_1$ is a divalent organic group derived from a diamine, $Y_2$ is a divalent aliphatic group or aromatic organic group derived from a diamine.

Specific examples of $Y_1$ include the following formulas:

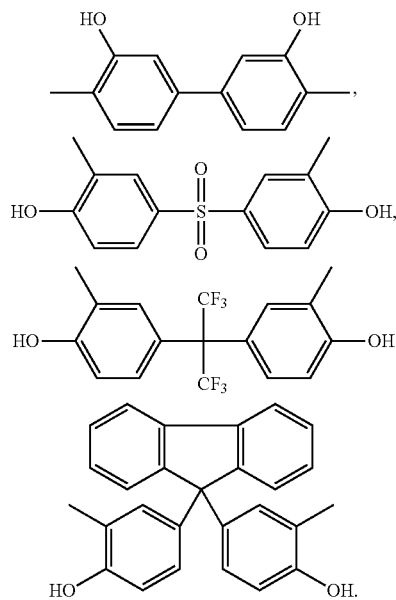

Specific examples of $Y_2$ include aromatic diamines, such as p-phenylenediamine, m-phenylenediamine, 2,4,6-trimethyl-1,3-phenylenediamine, 2,3,5,6-tetramethyl-1,4-phenylenediamine, 4,4'-diaminodiphenyl ether, 3,4'-diaminodiphenyl ether, 3,3'-diaminodiphenyl ether, 4,4'-diaminodiphenyl sulfide, 4,4'-diaminodiphenylmethane, 3,4'-diaminodiphenylmethane, 3,3'-diaminodiphenylmethane, 4,4'-methylene-bis(2-methylaniline), 4,4'-methylene-bis(2,6-dimethylaniline), 4,4'-methylene-bis(2,6-diethylaniline), 4,4'-methylene-bis(2-isopropyl-6-methylaniline), 4,4'-methylene-bis(2,6-diisopropylaniline), 4,4'-diaminodiphenylsulfone, 3,3'-diaminodiphenylsulfone, benzidine, o-tolidine, m-tolidine, 3,3',5,5'-tetramethylbenzidine, 2,2'-bis(trifluoromethyl)benzidine, 1,4-bis(4-aminophenoxy)benzene, 1,3-bis(4-aminophenoxy)benzene, 1,3-bis(3-aminophenoxy)benzene, bis[4-(4-aminophenoxy)phenyl]sulfone, bis[4-(3-aminophenoxy)phenyl]sulfone, 2,2-bis[4-(4-aminophenoxy)phenyl]propane, and 2,2-bis[4-(3-aminophenoxy)phenyl]propane; aliphatic diamines, such as 1,6-hexanediamine, 1,4-cyclohexanediamine, 1,3-cyclohexanediamine, 1,4-bis(aminomethyl)cyclohexane, 1,3-bis(aminomethyl)cyclohexane, 4,4'-diaminodicyclohexylmethane, 4,4'-diaminobenzanilide, 2,2-bis-[4-(4-aminophenoxy)phenyl]hexafluoropropane, 1,3-bis(3-aminopropyl)tetramethyldisiloxane, bis(p-aminophenoxy)dimethylsilane, diaminohexane, diaminododecane, 1,3-bis(4-aminophenoxy)benzene, 2,2-bis[4-(4-aminophenoxy)phenyl]propane, 1,1-bis(4-aminophenoxyphenyl)cyclohexane, bis[4-(4-aminophenoxy)phenyl]sulfone, 1,3-bis(3-aminophenoxy)benzene, 5-amino-1,3,3-trimethylcyclohexanemethylamine, 4,4'-bis(4-aminophenoxy)biphenyl, 1,1-bis(4-aminophenyl)cyclohexane, .alpha.,.alpha.'-bis(4-aminophenyl)-1,4-diisopropylbenzene, 1,3-bis(4-aminophenoxy)-2,2-dimethylpropane, 1,3-bis(4-aminophenoxy)benzene, 9,9-bis(4-aminophenyl)fluorine, and 4,4'-diamino-3,3'-dimethyldicyclohexylmethane, combinations of these, or the like.

In an embodiment the positive tone photosensitive polyimide solvent may be an organic solvent, and may comprise any suitable solvent such as ketones, alcohols, polyalcohols, ethers, glycol ethers, cyclic ethers, aromatic hydrocarbons, esters, propionates, lactates, lactic esters, alkylene glycol monoalkyl ethers, alkyl lactates, alkyl alkoxypropionates, cyclic lactones, monoketone compounds that contain a ring, alkylene carbonates, alkyl alkoxyacetate, alkyl pyruvates, ethylene glycol alkyl ether acetates, diethylene glycols, propylene glycol alkyl ether acetates, alkylene glycol alkyl ether esters, alkylene glycol monoalkyl esters, or the like.

Specific examples of materials that may be used as the positive tone photosensitive polyimide solvent for the positive tone photosensitive polyimide composition include acetone, methanol, ethanol, toluene, xylene, 4-hydroxy-4-methyl-2-pentatone, tetrahydrofuran, methyl ethyl ketone, cyclohexanone, methyl isoamyl ketone, 2-heptanone, ethylene glycol, ethylene glycol monoacetate, ethylene glycol dimethyl ether, ethylene glycol methylethyl ether, ethylene glycol monoethyl ether, methyl celluslve acetate, ethyl cellosolve acetate, diethylene glycol, diethylene glycol monoacetate, diethylene glycol monomethyl ether, diethylene glycol diethyl ether, diethylene glycol dimethyl ether, diethylene glycol ethylmethyl ether, diethylene glycol monoethyl ether, diethylene glycol monobutyl ether, ethyl 2-hydroxypropionate, methyl 2-hydroxy-2-methylpropionate, ethyl 2-hydroxy-2-methylpropionate, ethyl ethoxyacetate, ethyl hydroxyacetate, methyl 2-hydroxy-2-methylbutanate, methyl 3-methoxypropionate, ethyl 3-methoxypropionate, methyl 3-ethoxypropionate, ethyl 3-ethoxypropionate, ethyl acetate, butyl acetate, methyl lactate and ethyl lactate, propylene glycol, propylene glycol monoacetate, propylene glycol monoethyl ether acetate, propylene glycol monomethyl ether acetate, propylene glycol monopropyl methyl ether acetate, propylene glycol monobutyl ether acetate, propylene glycol monobutyl ether acetate, propylene glycol monomethyl ether propionate, propylene glycol monoethyl ether propionate, propylene glycol methyl ether adcetate, proplylene glycol ethyl ether acetate, ethylene glycol monomethyl ether acetate, ethylene glycol monoethyl ether acetate, propylene glycol monomethyl ether, propylene glycol monoethyl ether, propylene glycol monopropyl ether, propylene glycol monobutyl ether, ethylene glycol monomethyl ether, ethylene glycol monoethyl ether, propyl lactate, and butyl lactate, ethyl 3-ethoxypropionate, methyl 3-methoxypropionate, methyl 3-ethoxypropionate, and ethyl 3-methoxypropionate, β-propiolactone, β-butyrolactone, γ-butyrolactone, α-methyl-γ-butyrolactone, β-methyl-γ-butyrolactone, γ-valerolactone, γ-caprolactone, γ-octanoic lactone, α-hydroxy-γ-butyrolactone, 2-butanone, 3-methylbutanone, pinacolone, 2-pentanone, 3-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexene-2-one, 3-pentene-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone, 3-methylcycloheptanone, pylene carbonate, vinylene carbonate, ethylene carbonate, and butylene carbonate, acetate-2-methoxyethyl, acetate-2-ethoxyethyl, acetate-2-(2-ethoxyethoxy)ethyl, acetate-3-methoxy-3-methylbutyl, acetate-1-methoxy-2-propyl, dipropylene glycol, monomethylether, monoethylether, monopropylether, monobutylehter, monophenylether, dipropylene glycol monoacetate, dioxane, etheyl lactate, methyl acetate, ethyl acetate, butyl acetate, methyl puruvate, ethyl puruvate, propyl pyruvate, methyl methoxypropionate, ethyl ethoxypropionate, n-methylpyrrolidone (NMP), 2-methoxyethyl ether (diglyme), ethylene glycol monom-ethyl ether, propylene glycol monomethyl ether; methyl proponiate, ethyl proponiate and ethyl ethoxy proponiate, methylethyl ketone, cyclohexanone, 2-heptanone, carbon dioxide, cyclopentatone, cyclohexanone, ethyl 3-ethocypropionate, propylene glycol methyl ether acetate (PGMEA), methylene cellosolve, butyle acetate, and 2-ethoxyethanol, N-methylformamide, N,N-dimethylformamide, N-methylformanilide, N-methylacetamide, N,N-dimethylacetamide, N-methylpyrrolidone, dimethylsulfoxide, benzyl ethyl ether, dihexyl ether, acetonylacetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate, phenyl cellosolve acetate, or the like.

In an embodiment the positive tone photosensitive polyimide resin is placed into the positive tone photosensitive polyimide solvent along with the PACs and mixed to form the positive tone photosensitive polyimide composition. For example, the positive tone photosensitive polyimide resin may have a concentration of between about 5% and about 50%, such as about 25%, while the PACs may have a concentration of between about 0.1% and about 20%, such as about 5%. Once the positive tone photosensitive polyimide composition has been mixed to have a constant composition throughout the mixture, the positive tone photosensitive polyimide composition is applied to the second passivation layer 109 to a thickness of between about 1 µm to about 40 µm. The application may be performed using, e.g. a spin-coating method, although any suitable method may alternatively be utilized.

Figure 4:
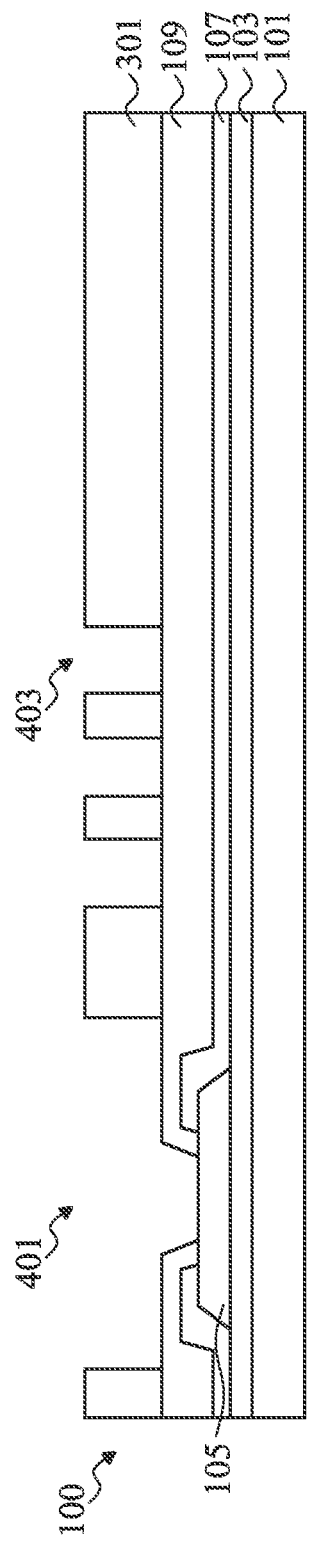
FIG. 4 illustrates a patterning and development of the third passivation layer in accordance with an embodiment.

FIG. 4 illustrates the patterning and development of the third passivation layer 301. In an embodiment the third passivation layer 301 may be patterned in order to form a second opening 401 and third openings 403. The second opening 401 may be formed over and connected to the first opening 217 in the second passivation layer 109 in order to expose a portion of the contact pad 105. The third openings 403 may be formed to define the dimensions of routing for conductive lines to be formed within the third passivation layer 301.

To pattern the third passivation layer 301, the substrate 101 along with the third passivation layer 301 may be placed into the imaging device 200 (described above with respect to FIG. 2A) or a different imaging device (not illustrated), and the third passivation layer 301 may be exposed to the patterned energy source 215 to define regions within the third passivation layer 301 for the second opening 401 and the third openings 403. In an embodiment the second opening 401 and the third openings 403 may have a width of between about 2 µm and about 300 µm, such as about 5 µm to about 300 µm. Additionally, the second opening 401 and the third openings 403 may be any desired shape, such as round, oval, polygonal, or the like.

Once exposed, the third passivation layer 301 may be developed using a second developer. In an embodiment the second developer may be a basic aqueous solution to remove those portions of the second passivation layer 109 which were exposed to the patterned energy 215 and which have had their solubility modified and changed through the chemical reactions. Such basic aqueous solutions may include tetra methyl ammonium hydroxide (TMAH), tetra butyl ammonium hydroxide, sodium hydroxide, potassium hydroxide, sodium carbonate, sodium bicarbonate, sodium silicate, sodium metasilicate, aqueous ammonia, monomethylamine, dimethylamine, trimethylamine, monoethylamine, diethylamine, triethylamine, monoisopropylamine, diisopropylamine, triisopropylamine, monobutylamine, dibutylamine, monoethanolamine, diethanolamine, triethanolamine, dimethylaminoethanol, diethylaminoethanol, potassium metasilicate, sodium carbonate, tetraethylammonium hydroxide, combinations of these, or the like.

The second developer may be applied to the third passivation layer 301 using, e.g., a spin-on process. In this process the second developer is applied to the third passivation layer 301 from above the third passivation layer 301 while the semiconductor device 100 (and the third passivation layer 301) is rotated. In an embodiment the second developer may be at a temperature of between about 10° C. and about 80° C., such as about 50° C., and the development may continue for between about 1 minute to about 60 minutes, such as about 30 minutes.

Figure 5:
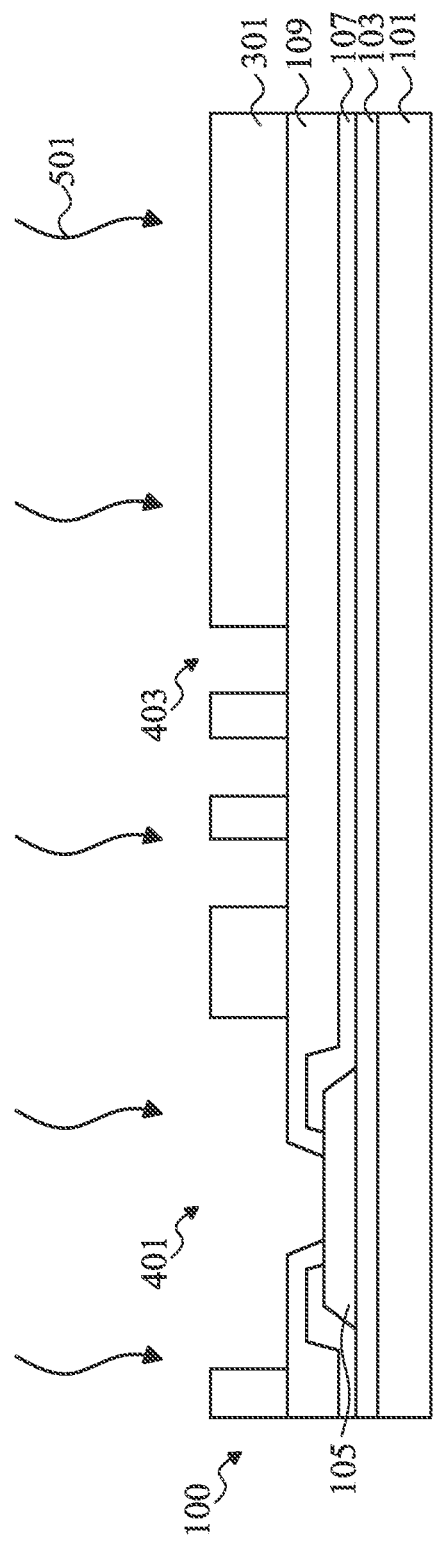
FIG. 5 illustrates a curing process in accordance with an embodiment.

FIG. 5 illustrates that, once the third passivation layer 301 has been patterned and developed, the third passivation layer 301 and the second passivation layer 109 may be cured (represented in FIG. 5 by the wavy lines labeled 501). In an embodiment the curing process 501 may be performed by placing the substrate 101 along with the second passivation layer 109 and the third passivation layer 301 onto, e.g., a hot plate or other type of heating apparatus, wherein the temperature of the second passivation layer 109 and the third passivation layer 301 may be increased. In an embodiment the curing process may be performed at a temperature of 150° C. to about 400° C. for a time of between about 1 hour to about 2 hours.

Additionally, after the curing process, a descum process may be utilized in order to remove undesired residue or particles that may remain on the contact pad 105, the second passivation layer 109, and the third passivation layer 301 after the patterning, developments, and curing process. In an embodiment the descum process comprises exposing the contact pad 105, the second passivation layer 109, and the third passivation layer 301 to a plasma environment, such as an oxygen plasma environment, in order to react and remove any undesired residue. In a particular embodiment the descum process may be a reactive ion etch process.

Figure 6:
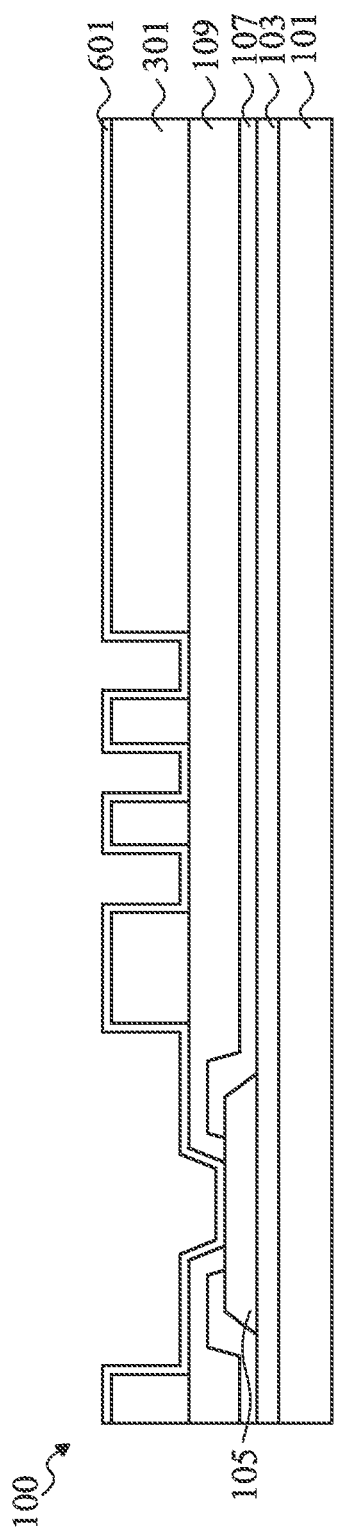
FIG. 6 illustrates a formation of a seed layer in accordance with an embodiment.

FIG. 6 illustrates a formation of a seed layer 601. Once the second passivation layer 109 and the third passivation layer 301 have been formed, the seed layer 601 may be formed within the first opening 217, the second opening 401, and the third openings 403. In an embodiment the seed layer 601 may be, e.g., a titanium copper alloy, although any suitable material, such as copper, may alternatively be utilized. The seed layer 601 may be formed through a suitable formation process such as CVD or sputtering.

Figure 7:
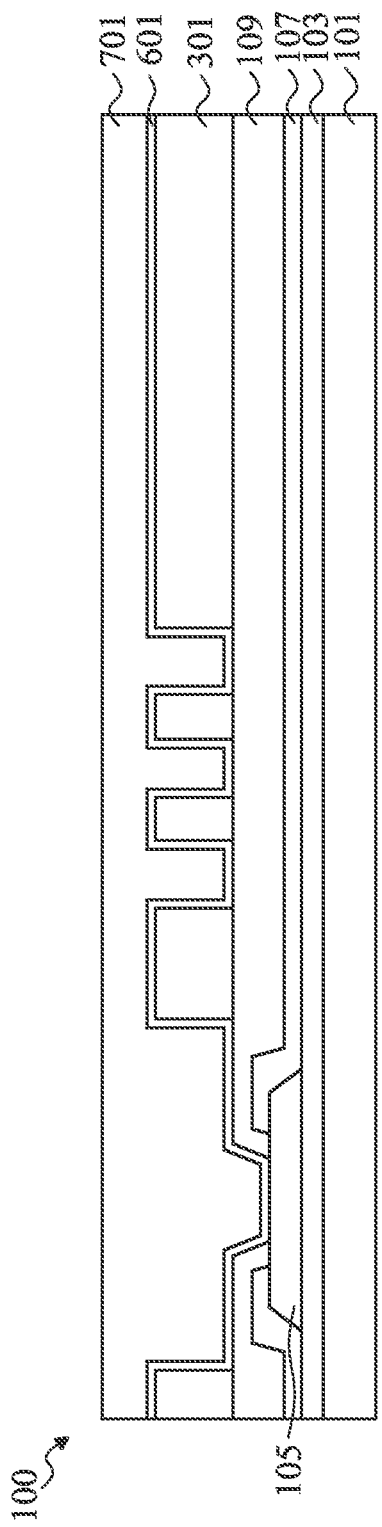
FIG. 7 illustrates a formation of a conductive material in accordance with an embodiment.

FIG. 7 illustrates a formation of conductive material 701 on the seed layer 601, filling and overfilling the first opening 217, the second opening 401, and the third openings 403. In an embodiment the conductive material 701 may comprise copper, although other suitable materials, such as AlCu or Au, may alternatively be utilized. The conductive material 701 may be formed through a deposition process such as electroplating or electroless plating, although other methods may such as CVD or PVD may alternatively be utilized.

Figure 8:
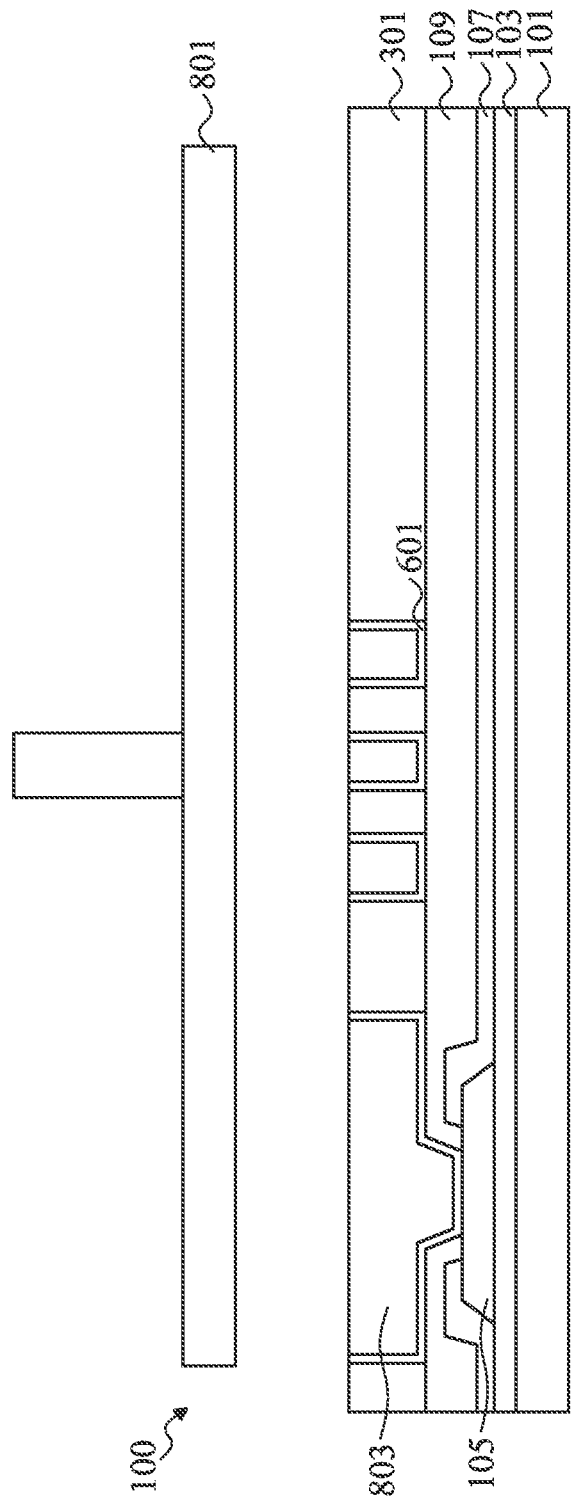
FIG. 8 illustrates a planarization process in accordance with an embodiment.

FIG. 8 illustrates a planarization process such as a chemical mechanical polishing (CMP) process that may be used to remove excess amounts of the conductive material 701 from those regions outside of the first opening 217, the second opening 401, and the third openings 403 and form the PPI 803. In an embodiment in which the planarization process is a CMP, a combination of etching materials and abrading materials are put into contact with the conductive material 701 and a grinding pad 801 is used to grind away the conductive material 701 until the conductive material 701 is planarized with the third passivation layer 301.

After planarization, the PPI 803 and the third passivation layer 301 may be cleaned in order to remove any undesired residue that may have remained after the planarization process. In an embodiment the PPI 803 and the third passivation layer 301 may be cleaned by rinsing the PPI 803 and the passivation layer 301 with deionized water. Alternatively, a Standard Clean-1 (SC-1) or a Standard Clean-2 (SC-2) cleaning process may be used. All such cleaning processes are fully intended to be included within the scope of the embodiments.

Once the PPI 803 and the third passivation layer 301 have been cleaned, the PPI 803 and the passivation layer 301 may be baked. In an embodiment the PPI 803 and the third passivation layer 301 may be baked by placing the substrate 101 along with the PPI 803 and the passivation layer 301 into a furnace or other heating device (e.g., a hot plate) and increasing the temperature of the third passivation layer 301 and the PPI 803 to a temperature of between about 150° C. and about 450° C., such as about 200° C. The PPI 803 and the third passivation layer 301 may be baked for a time of between about 5 min and about 240 min, such as about 60 min.

By forming the PPI 803 as described herein, issues surrounding the formation of the PPI 803 may be reduced or eliminated. In particular, by using these embodiments, an undercut issue between a seed layer and an overlying electroplated layer that is usually present for fine pitches (e.g., less than about 5 μm) may be avoided, while also lowering costs and avoiding any loss of critical dimensions. Additionally, the seed layer 601 in these embodiments is also located along the sidewalls of the PPI 803, and there is no depth bias associated with these embodiments. Finally, as the PPI 803 in these embodiments have a corner round profile, there is no crown issue as with some other processes.

Figure 9:
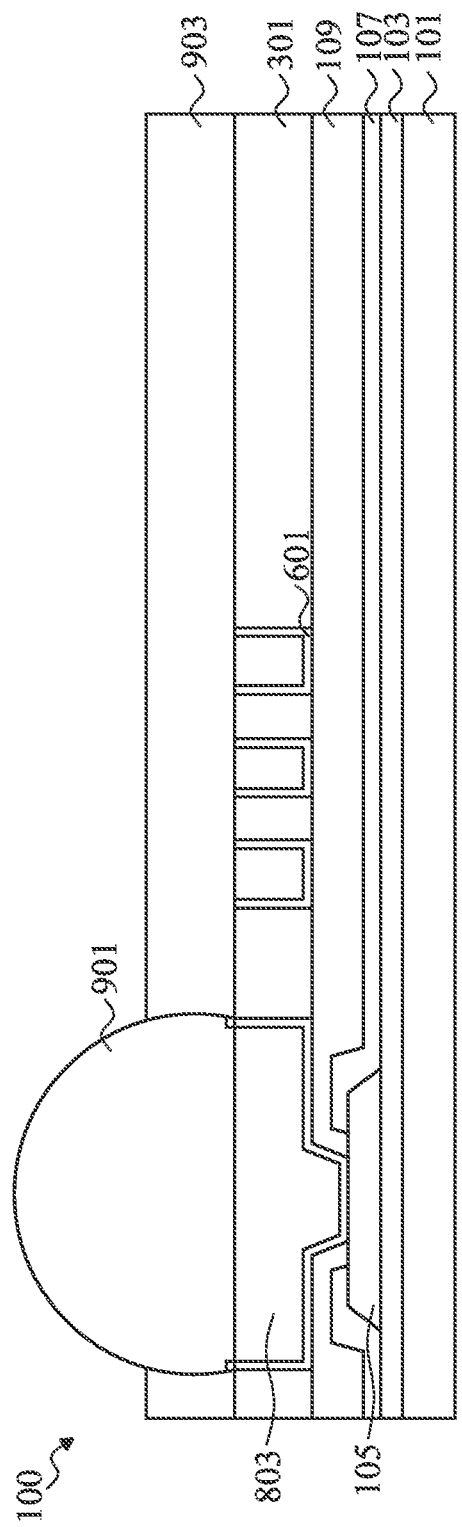
FIG. 9 illustrates an external contact and buffer layer in accordance with an embodiment.

FIG. 9 illustrates a placement of an external contact 901 along with a the placement of a buffer layer 903. In an embodiment the external contact 901 may comprise a material such as tin, or other suitable materials, such as silver, lead-free tin, or copper. In an embodiment in which the external contact 901 is a tin solder bump, the external contact 901 may be formed by initially forming a layer of tin through such commonly used methods such as evaporation, electroplating, printing, solder transfer, ball placement, etc., to a thickness of, e.g., about 100 μm. Once a layer of tin has been formed on the structure, a reflow may be performed in order to shape the material into the desired bump shape.

Once the external contact 901 has been placed and reflowed, the buffer layer 903 may be placed or formed on the third passivation layer 301 in order to protect and buffer the underlying structures. In an embodiment the buffer layer 902 is a dielectric passivation material such as silicon dioxide, polyimide, or the like, that may be placed or formed, depending at least in part on the precise material chosen, using a process such as chemical vapor deposition, physical vapor deposition, spin-coating, or the like. The buffer layer 902 may be formed to a thickness of between about 5 μm and about 200 μm, such as about 100 μm.

In accordance with an embodiment, a semiconductor device comprising a patterned positive tone photosensitive material over a substrate is provided. The patterned positive tone photosensitive material comprises openings. A seed layer is along the openings and a conductive material is adjacent to the seed layer.

In accordance with another embodiment, a semiconductor device comprising a patterned negative tone photosensitive polyimide layer over a substrate is provided. A patterned positive tone photosensitive polyimide layer is over and in contact with the patterned negative tone photosensitive polyimide layer, the patterned positive tone photosensitive polyimide layer comprising at least one opening.

In accordance with yet another embodiment, a method of manufacturing a semiconductor device comprising placing a first photosensitive material over a conductive region over a substrate is provided. The first photosensitive material is patterned to remove unexposed first photosensitive material and expose the conductive region. A second photosensitive material is placed over the first photosensitive material. The second photosensitive material is patterned to remove unexposed second photosensitive material and expose the conductive region, the patterning the second photosensitive material forming a patterned second photosensitive material and at least one opening in the patterned second photosensitive material. A seed layer is formed along sidewalls of the at least one opening.

Although the present embodiments and their advantages have been described in detail, it should be understood that various changes, substitutions and alterations can be made herein without departing from the spirit and scope of the embodiments as defined by the appended claims. For example, the precise shape of the first opening, the second opening, and the third openings may be changed, or the precise methods of formation may be altered. Additionally, any suitable number of masks for the die, such as two masks, three masks, four masks, or any other suitable number of masks, may be utilized.

Moreover, the scope of the present application is not intended to be limited to the particular embodiments of the process, machine, manufacture, composition of matter, means, methods and steps described in the specification. As one of ordinary skill in the art will readily appreciate from the disclosure of the embodiments, processes, machines, manufacture, compositions of matter, means, methods, or steps, presently existing or later to be developed, that perform substantially the same function or achieve substantially the same result as the corresponding embodiments described herein may be utilized according to the embodiments. Accordingly, the appended claims are intended to include within their scope such processes, machines, manufacture, compositions of matter, means, methods, or steps.

What is claimed is:

1. A method of manufacturing a semiconductor device, the method comprising:
    applying a positive tone photosensitive material over a negative tone photosensitive material over a substrate;
    forming one or more openings through the positive tone photosensitive material and the negative tone photosensitive material;
    forming a first conductive material to extend through the positive tone photosensitive material and the negative tone photosensitive material to make electrical connection with a contact pad; and
    forming a second conductive material to extend through the positive tone photosensitive material, wherein after the forming the second conductive material a first surface of the second conductive material faces a second surface of the negative tone photosensitive material, the second surface of the negative tone photosensitive material facing away from the substrate, wherein the negative tone photosensitive material comprises a first polymer with the following structure:

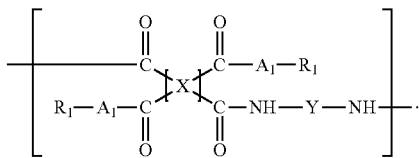

where X is a tetravalent organic group derived from alicyclic tetracarboxylic acid dianhydrides having 3 to 30 carbon atoms; $A_1$ is an oxygen atom or an NH group; Y is a di-valent organic group derived from aliphatic, alicyclic, or non-conjugated aromatic diamines with carbon atoms between 3 and 30, wherein side chains have one or more ethylenically unsaturated, cross-linkable bonds; and $R_1$ is a hydrogen atom or an organic group having 1 to 20 carbon atoms including one or more ethylenically unsaturated bonds or is a group comprising a photopolymerizable olefin double bond.

2. The method of claim 1, wherein R1 comprises the following structure:

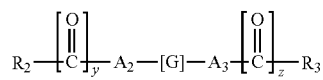

where $R_2$ is an aryl residue such as $C_2H_3$ or $C_3H_5$, $R_3$ is a residue with at least one photopolymerizable olefin double bond, G is a divalent aliphatic or aromatic group, $A_2$ is an oxygen atom or an NR group, in which R indicates a hydrogen atom or a $C_1$-$C_4$ alkyl group, $A_3$ is an oxygen atom or an NR group, y is 0 or 1 and z is 0 or 1.

3. The method of claim 1, wherein the positive tone photosensitive material comprises a first polymer with the following structure:

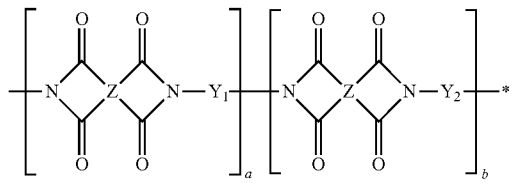

where Z is a tetravalent organic group derived from one or more tetracarboxylic acids, including 3,4-dicarboxy-1,2,3,4-tetrahydro-6-tert-butyl-1-naphthalene succinic dianhydride (DTBDA), or derivatives thereof, a is from 1 to 150, b is from 1 to 400, $Y_1$ is a divalent organic group derived from a diamine, $Y_2$ is a divalent aliphatic group or aromatic organic group derived from a diamine.

4. The method of claim 3, wherein $Y_1$ comprises:

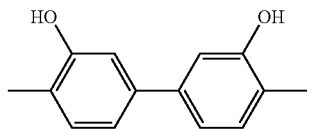

5. The method of claim 3, wherein $Y_1$ comprises:

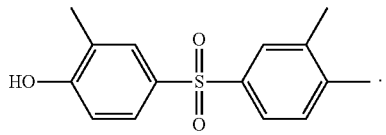 [SMILES: Cc1ccc(S(=O)(=O)c2ccc(O)c(C)c2)cc1C]

6. The method of claim 3, wherein $Y_1$ comprises:

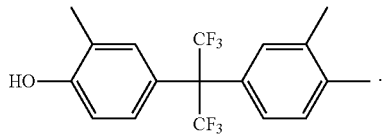 [SMILES: Cc1ccc(C(c2ccc(O)c(C)c2)(C(F)(F)F)C(F)(F)F)cc1C]

7. A method of manufacturing a semiconductor device, the method comprising:
coating a dielectric layer with a negative tone photosensitive material, the dielectric layer exposing a first portion of a first contact pad;
patterning and developing the negative tone photosensitive material;
coating the negative tone photosensitive material with a positive tone photosensitive material;
patterning and developing the positive tone photosensitive material to expose a first portion of the negative tone photosensitive material and also to expose the first portion of the first contact pad, wherein the first portion of the negative tone photosensitive material is separated from the first portion of the first contact pad by the positive tone photosensitive material;
depositing a seed layer over the first portion of the negative tone photosensitive material and the first portion of the first contact pad; and
plating a conductive material onto the seed layer.

8. The method of claim 7, further comprising curing both the negative tone photosensitive material and the positive tone photosensitive material after the patterning and developing the positive tone photosensitive material.

9. The method of claim 7, further comprising performing a descum process after the patterning and developing the positive tone photosensitive material, wherein the descum process utilizes an oxygen plasma environment.

10. The method of claim 7, further comprising performing a descum process after the patterning and developing the positive tone photosensitive material, wherein the descum process utilizes a reactive ion etch.

11. The method of claim 7, further comprising planarizing the conductive material after the plating the conductive material.

12. The method of claim 11, further comprising cleaning the positive tone photosensitive material and the conductive material after the planarizing the conductive material.

13. The method of claim 12, further comprising baking the positive tone photosensitive material and the conductive material after the cleaning the positive tone photosensitive material and the conductive material.

14. A method of manufacturing a semiconductor device, the method comprising:
depositing a passivation layer over a contact pad over a semiconductor substrate;
exposing a first portion of the contact pad through the passivation layer;
applying a negative tone polyimide material to both the passivation layer and the contact pad;
applying a first developer to the negative tone polyimide material to remove unexposed portions of the negative tone polyimide material and expose the first portion of the contact pad;
applying a positive tone polyimide material to both the first portion of the contact pad and the negative tone polyimide material;
imaging the positive tone polyimide material to form a first exposure region and a second exposure region with a non-exposed region between the first exposure region and the second exposure region;
applying a second developer to the positive tone polyimide material to remove the first exposure region and expose the first portion of the contact pad and remove the second exposure region and expose a first surface of the negative tone polyimide material, the first surface of the negative tone polyimide material facing away from the semiconductor substrate; and
forming a conductive material over both the first portion of the contact pad and the first surface of the negative tone polyimide material.

15. The method of claim 14, wherein the forming the conductive material further comprises:
depositing a seed layer over the first portion of the contact pad and the first surface, wherein the seed layer covers exposed sidewalls of the positive tone polyimide material; and
plating a conductive material onto the seed layer.

16. The method of claim 14, further comprising curing both the negative tone polyimide material and the positive tone polyimide material after the applying the second developer.

17. The method of claim 16, further comprising exposing the negative tone polyimide material and the positive tone polyimide material to an oxygen plasma environment after the applying the second developer and before the forming the conductive material.

18. The method of claim 14, further comprising exposing the negative tone polyimide material and the positive tone polyimide material to a reactive ion etching process after the applying the second developer and before the forming the conductive material.

19. The method of claim 14, wherein the conductive material is part of a post-passivation interconnect with a pitch of less than about 5 µm.

20. The method of claim 1, further comprising curing the positive tone photosensitive material and the negative tone photosensitive material.

* * * * *